(12) United States Patent
Ikarashi

(10) Patent No.: US 6,580,331 B2
(45) Date of Patent: Jun. 17, 2003

(54) VOLTAGE CONTROLLED OSCILLATOR FOR OSCILLATING SIGNALS WITH HIGH C/N RATIO

(75) Inventor: Yasuhiro Ikarashi, Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 67 days.

(21) Appl. No.: 09/836,819

(22) Filed: Apr. 17, 2001

(65) Prior Publication Data

US 2001/0030583 A1 Oct. 18, 2001

(30) Foreign Application Priority Data

Apr. 18, 2000 (JP) .......................... 2000-122384

(51) Int. Cl.⁷ .............................. H03B 5/18
(52) U.S. Cl. ................... 331/117 D; 331/177 V
(58) Field of Search ................ 331/117 D, 177 V, 331/99, 117 R

(56) References Cited

U.S. PATENT DOCUMENTS

| | | | |
|---|---|---|---|
| 4,189,690 A | 2/1980 | Bock et al. .......... | 332/30 V |
| 4,684,904 A | 8/1987 | Watkins et al. ...... | 33/117 R |
| 5,859,573 A | * 1/1999 | Kukkonen .......... | 331/117 R |
| 5,900,788 A | * 5/1999 | Hagemeyer ......... | 331/107 |
| 5,905,414 A | * 5/1999 | Motoi ............... | 331/117 D |
| 6,169,461 B1 | * 1/2001 | Andoh et al. ....... | 331/107 SL |

FOREIGN PATENT DOCUMENTS

JP 60018024 1/1985

* cited by examiner

Primary Examiner—Robert Pascal
Assistant Examiner—Joseph Chang
(74) Attorney, Agent, or Firm—Brinks Hofer Gilson & Lione

(57) ABSTRACT

A voltage controlled oscillator includes an oscillating transistor having a collector coupled to ground at high frequencies. A first end of a microstrip is coupled to a base of the oscillating transistor by a first varactor diode. A second end of the microstrip is coupled to a second varactor diode. The length of the microstrip is about ½ to about ¾ of the wavelength of an oscillation frequency.

9 Claims, 3 Drawing Sheets

VOLTAGE CONTROLLED OSCILLATOR FOR OSCILLATING SIGNALS WITH HIGH C/N RATIO

BACKGROUND

1. Field of the Invention

The present invention relates to a voltage controlled oscillator, and more particularly, to a voltage controlled oscillator that oscillates in a high frequency band.

2. Description of the Related Art

FIG. 5 illustrates a conventional voltage controlled oscillator. The collector of an oscillating transistor 21 is coupled to a ground through a capacitor 22. A feedback capacitor 23 connects the base to the emitter of the oscillating transistor 21, and a capacitor 24 connects the emitter of the oscillating transistor 21 to ground.

A resonant circuit 25 is connected to the base of the oscillating transistor 21. The resonant circuit 25 includes a microstrip 25a, a first and a second varactor diode 25b and 25c. The cathodes of the varactor diodes 25b and 25c are interconnected in series. The anode of the first varactor diode 25b is grounded, and the anode of the second varactor diode 25c is connected to the microstrip 25a through a capacitor 25d. The microstrip 25a is directly connected to ground and indirectly connected to the base of the oscillating transistor 21 through a capacitor 25e. The microstrip 25a is a linear conductor. The length of the microstrip 25a is slightly shorter than a quarter of the wavelength of an oscillation frequency.

The anode of the second varactor diode 25c is grounded through an inductor 26. A control voltage is applied to the cathode of the first varactor diode 25b and the cathode of the second varactor diode 25c through an inductor 27. By varying the control voltage, the oscillation frequency is adjusted.

In the above-described circuit, the internal capacitance of each of the varactor diodes 25b and 25c is controlled by the inductive and capacitive coupling circuit. To oscillate at a high frequency, the capacitance increases, while the Q factor of the resonant circuit decreases. Hence the carrier-to-noise (C/N) ratio of the oscillation signal decreases.

SUMMARY

According to a first aspect, a voltage controlled oscillator includes an oscillating transistor. The collector of the oscillating transistor is coupled to ground when the oscillating transistor generates a high frequency output. A microstrip is coupled to the base of the oscillating transistor through a first varactor diode and a capacitor. A second varactor diode couples the microstrip to ground. The length of the microstrip is preferably within about ½ to about ¾ of the oscillation frequency of the voltage controlled oscillator.

Preferably, a cathode of the first varactor diode is coupled to a first end of the microstrip and an anode of the first varactor diode is preferably coupled to ground through a first inductor. Preferably, a cathode of the second varactor diode is coupled to a second end of the microstrip and an anode of the second varactor diode is preferably grounded. A control voltage is preferably supplied to the cathodes of the first and second varactor diodes by a power source or a bias circuit.

Preferably, the microstrip is longer than the above-described conventional microstrip, and hence, the Q factor of a resonant circuit increases. As a result, the C/N ratio of an oscillation signal increases, and the deterioration of the Q factor of the resonant circuit, tuned by the control voltage, does not occur or is minimized. Moreover, the second inductor does not require a large inductance, and hence, the second inductor can be replaced by a second microstrip. Preferably, the second microstrip is shorter than the microstrip coupled between the first and second varactor diodes.

DESCRIPTION OF THE PRESENTLY PREFERRED EMBODIMENTS

Figure 1:
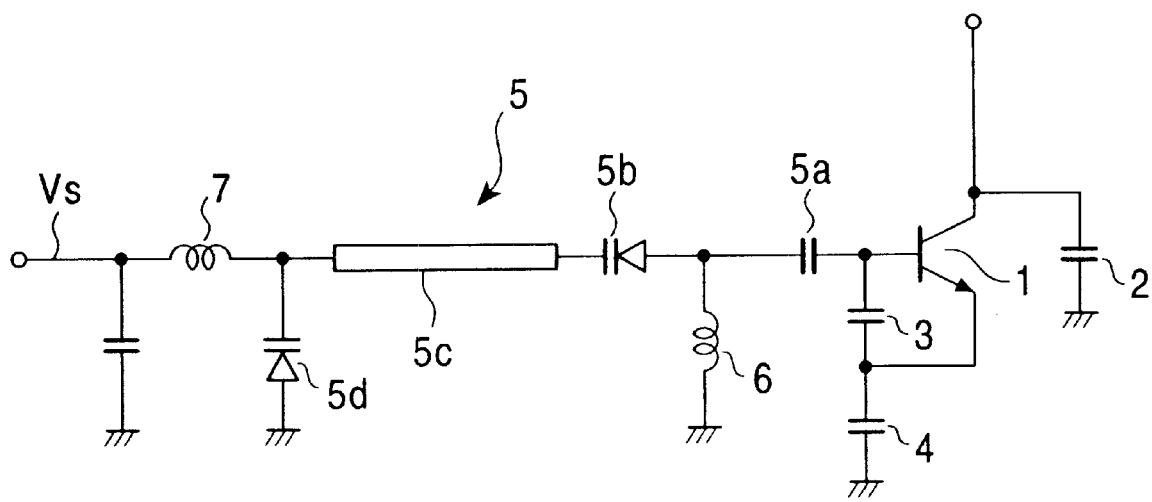
FIG. 1 is a voltage controlled oscillator according to a first embodiment.

A voltage controlled oscillator according to an embodiment is described with reference to the accompanying drawings. Referring to FIG. 1, the collector of an oscillating transistor I is coupled to a ground through a capacitor 2. Preferably, the capacitor 2 is a direct current (DC) blocking capacitor that acts as a virtual short to ground at high frequencies. A feedback capacitor 3 is connected to a base and an emitter of the oscillating transistor 1. A coupling capacitor 4 couples the emitter and the feedback capacitor 3 to ground. Preferably, a bias circuit or a power source applies a DC bias to the base of the oscillating transistor 1.

A resonant circuit 5 is coupled to the base of the oscillating transistor 1. The resonant circuit 5, preferably comprises a capacitor such as a preferred Clapp capacitor 5a, a first varactor diode 5b, a microstrip 5c, and a second varactor diode 5d. Preferably, an anode of the first varactor diode 5b is coupled to the base of the oscillating transistor 1 through the Clapp capacitor 5a. Preferably, a cathode of the first varactor diode 5b is coupled to a first end of the microstrip 5c. A second end of the microstrip 5c is coupled to a cathode of the second varactor diode 5d. Preferably, the anode of the second varactor diode 5d is coupled to ground. The length L of the microstrip 5c is preferably within a range of about ½ to about ¾ of the wavelength of the periodic output of the oscillating transistor 1. Preferably, the length L is slightly longer than about ½ of the wavelength of the oscillation frequency.

Preferably, the anode of the first varactor diode 5b is coupled to ground through a first inductor 6. A control voltage Vs, generated by a voltage source, is applied to a node between the cathode of the second varactor diode 5d and the microstrip 5c through a second inductor 7. The control voltage Vsbiases the cathode of the first varactor diode 5b through the microstrip 5c. The internal capacitance of the first varactor diode 5b and the internal capacitance of the second varactor diode 5d is preferably adjusted by the control voltage Vs.

Circuit components, such as the oscillating transistor 1, the first and second varactor diodes 5b and 5d, etc., are preferably coupled to a printed circuit board. Preferably, the microstrip 5c comprises a line conductor made of a conductive foil. The foil can be affixed to the top surface of the printed circuit board. In alternative embodiments, the microstrip is preferably a planar conducting line comprising one or more thin conducting strips of finite width positioned parallel to a single extended conducting ground plane. In one embodiment, the strips are affixed to an insulating substrate attached to a ground plane.

Figure 2:
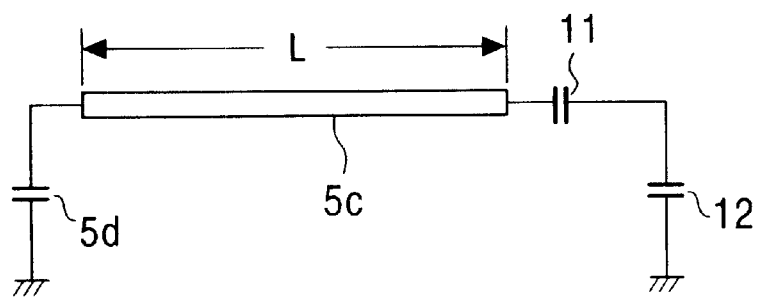
FIG. 2 is a circuit diagram of an exemplary resonant circuit within the voltage controlled oscillator.

Preferably, the resonant circuit 5 is connected in series to the feedback capacitor 3 and coupling capacitor 4. Preferably, the second end of the microstrip 5c is terminated at the second varactor diode 5d, and the first end of the microstrip 5c is terminated at a capacitive circuit. Preferably, the capacitive circuit comprises two lumped capacitors 11 and 12 connected in series. Lumped capacitor 11 is preferably equivalent to the first varactor diode 5b and the Clapp capacitor 5a. Preferably lumped capacitor 12 is equivalent to the feedback capacitor 3 and the coupling capacitor 4. Referring to FIG. 2, the overall resonant circuit forms an equivalent $\lambda/2$ resonant circuit. Preferably, the $\lambda/2$ resonant circuit is a series resonant circuit. The length L of the microstrip Sc is preferably within the range of about $\lambda/2$ to about $3\lambda/4$.

Figure 3:
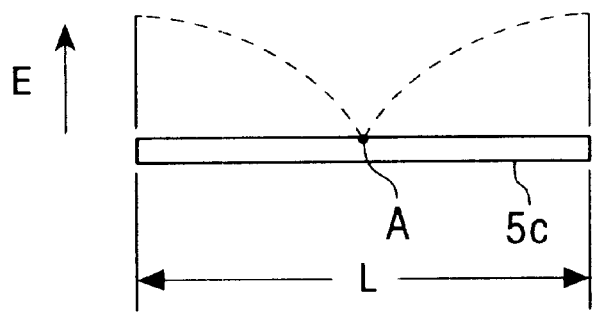
FIG. 3 illustrates a voltage standing wave on a microstrip in the voltage controlled oscillator.

Referring to FIG. 3, as the length L of the microstrip 5c is increased, a voltage node appears near the center or a middle portion of the microstrip 5c in a longitudinal direction in this embodiment. The position of the voltage node A can deviate with variations in the internal capacitance of the first and second varactor diodes 5b and 5d. Since the first and second varactor diodes 5b and 5d couple the first and second ends of the microstrip 5c, the deviation of node A's position is preferably small even when the oscillation frequency varies.

Preferably, the potential at node A is at a ground potential at high frequencies. Thus, the impedance between node A and ground is small or substantially decreased at high frequencies. When another circuit element is connected to the voltage node A, preferably the oscillation frequency does not vary substantially.

Figure 4:
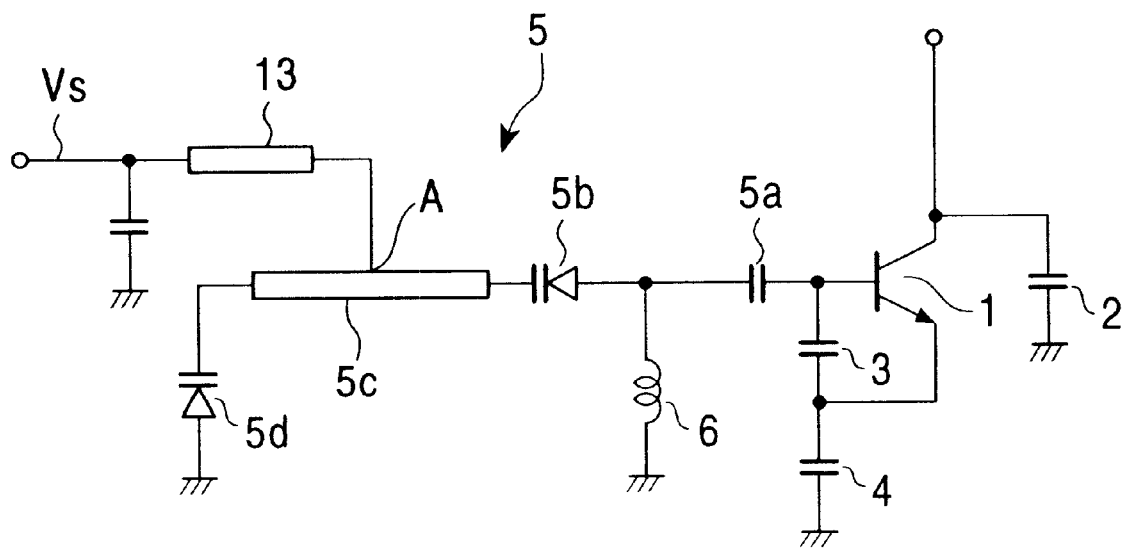
FIG. 4 is a circuit diagram of a second embodiment of a voltage controlled oscillator.
Figure 5:
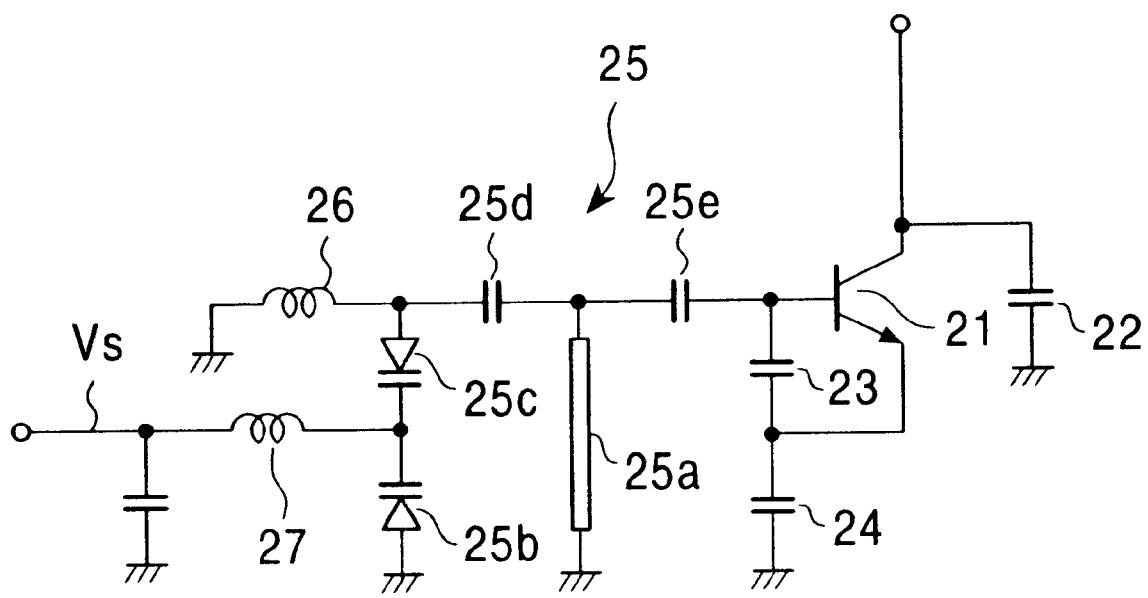
FIG. 5 is a circuit diagram of a conventional voltage controlled oscillator.

Referring to FIG. 4, an inductor 13 is coupled to node A of the microstrip 5c, and a control voltage generated by a power source is applied to the inductor 13 in a second embodiment. In this embodiment, the inductive value of the inductor 13 is small. Thus, the inductor 13 can comprise a microstrip, preferably, shorter in length than the microstrip 5c. As shown, the collector of the oscillating transistor 1 is coupled to ground through the capacitor 2. Preferably, the capacitor 2 is a blocking capacitor that acts as a virtual short to ground at high frequencies. The feedback capacitor 3 is coupled to the base and the emitter of the oscillating transistor 1. The coupling capacitor 4 couples the emitter and the feedback capacitor 3 to ground.

A resonant circuit 5 is coupled to the base of the oscillating transistor 1. The resonant circuit 5, preferably comprises a capacitor 5a, and a first varactor diode 5b, a microstrip 5c, and a second varactor diode 5d. An anode of the first varactor diode 5b is coupled to the base of the oscillating transistor 1 through the capacitor 5a. A cathode of the first varactor diode 5b is coupled to a first end of the microstrip 5c. A second end of the microstrip 5c is coupled to a cathode of the second varactor diode 5d. Preferably, the anode of the second varactor diode 5d is coupled to ground. The length L of the microstrip 5c is preferably within a range of about ½ to about ¾ of the wavelength of the periodic output. Preferably, the length L is slightly longer than ½ of the wavelength of the oscillation frequency of the output of the oscillating transistor 1.

Preferably, the anode of the first varactor diode 5b is coupled to ground through a first inductor 6. A control voltage Vs, generated by a power source, is applied to node A between the first and the second end of the microstrip 5c through an inductor 13 or second microstrip. The control voltage biases the first and second varactor diodes 5b and 5d through the microstrip 5c. The internal capacitance of the first varactor diode 5b and the internal capacitance of the second varactor diode 5d is preferably adjusted by the control voltage Vs.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A voltage controlled oscillator comprising:
   a capacitor coupled to a ground;
   an oscillating transistor comprising a base and a collector, the collector being coupled to the capacitor;
   a microstrip having a first end and a second end;
   a first varactor diode coupled to the base of the oscillating transistor;
   a cathode of the first varactor diode coupled to the first end of the microstrip; and
   a second varactor diode coupled to the second end of the microstrip;
   wherein the length of the microstrip is about ½ to ¾ of a wave length of an oscillation frequency of an output of the oscillating transistor and one end of a first inductor is coupled to the second end of the microstrip and a control voltage is applied to the second end of the microstrip.

2. A voltage controlled oscillator according to claim 1, wherein
   an anode of the first varactor diode is coupled to ground through a second inductor;
   a cathode of the second varactor diode is coupled to the second end of the microstrip;
   an anode of the second varactor diode is coupled to ground; and
   a voltage source configured to provide the control voltage to the cathodes of the first and second varactor diodes at a node between the first and the second end of the microstrip.

3. The controlled oscillator according to claim 1 further comprising a second microstrip, the second microstrip being coupled to the microstrip having the first and the second ends.

4. The controlled oscillator according to claim 3, wherein the second microstrip is coupled between the first and the second ends of the microstrip.

5. The controlled oscillator according to claim 3, wherein the second microstrip is coupled substantially near a middle portion of the microstrip having the first and the second ends.

6. The controlled oscillator of claim 5, wherein the oscillating transistor comprises an NPN transistor.

7. A voltage controlled oscillator comprising:
   a capacitor coupled to a ground;
   a transistor comprising a base and a collector, the collector being coupled to the capacitor;
   a first microstrip having a first end and a second end;
   a first varactor diode coupled to the first end of the first microstrip and to the base of the transistor;
   a second varactor diode coupled to the second end of the first microstrip; and a second microstrip coupled to the first microstrip;

wherein the length of the first microstrip is about ½ to about ¾ of a wave length of an oscillation frequency of an output of the transistor and one end of a first inductor is coupled to the first end of the first micro strip.

8. A voltage controlled oscillator comprising:

a capacitor coupled to a ground;

a transistor comprising a base and a collector, the collector being coupled to the capacitor;

a first microstrip having a first end and a second end;

a first varactor diode coupled to the first end of the first microstrip and to the base of the transistor;

a second varactor diode coupled to the second end of the first microstrip; and a second microstrip coupled to the first microstrip between the first and second ends of the first micro strip;

wherein the length of the first microstrip is about ½ to about ¾ of a wavelength of an oscillation frequency of an output of the transistor and one end of a first inductor is coupled to the first end of the first microstrip.

9. A voltage controlled oscillator comprising:

a capacitor coupled to a ground;

a transistor comprising a base and a collector, the collector being coupled to the capacitor;

a first microstrip having a first end and a second end;

a first varactor diode coupled to the first end of the first micro strip and to the base of the transistor;

a second varactor diode coupled to the second end of the first microstrip; and a second microstrip coupled to the first microstrip; and a voltage source coupled to the second microstrip;

wherein the length of the first microstrip is about ½ to about ¾ of a wave length of an oscillation frequency of an output of the transistor and one end of a first inductor is coupled to the first end of the first microstrip.

* * * * *

UNITED STATES PATENT AND TRADEMARK OFFICE
CERTIFICATE OF CORRECTION

PATENT NO. : 6,580,331 B2
DATED : June 17, 2003
INVENTOR(S) : Yasuhiro Ikarashi

It is certified that error appears in the above-identified patent and that said Letters Patent is hereby corrected as shown below:

<u>Title page,</u>
Item [56], References Cited, FOREIGN PATENT DOCUMENTS, insert
-- JP   8-335828    12/1996 --.

Signed and Sealed this

Sixteenth Day of December, 2003

JAMES E. ROGAN
*Director of the United States Patent and Trademark Office*